United States Patent [19]
Hada et al.

[11] Patent Number: 5,911,836
[45] Date of Patent: *Jun. 15, 1999

[54] METHOD OF PRODUCING SEMICONDUCTOR DEVICE AND RINSE FOR CLEANING SEMICONDUCTOR DEVICE

[75] Inventors: Mayumi Hada; Ryuji Hasemi; Hidetoshi Ikeda; Tetsuo Aoyama, all of Niigata, Japan

[73] Assignee: Mitsubishi Gas Chemical Company, Inc., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/781,774

[22] Filed: Jan. 9, 1997

[30] Foreign Application Priority Data

Feb. 5, 1996 [JP] Japan .................................. 8-018964
Feb. 5, 1996 [JP] Japan .................................. 8-018965

[51] Int. Cl.⁶ .............................. B08B 3/08; H01L 21/44
[52] U.S. Cl. .................................... 134/2; 134/3; 134/28; 134/38; 438/700; 438/906
[58] Field of Search ................................. 134/23, 26, 27, 134/29, 28, 38; 438/700, 768, 906

[56] References Cited

U.S. PATENT DOCUMENTS

| | | | |
|---|---|---|---|
| 4,744,834 | 5/1988 | Haq | 134/38 |
| 5,037,724 | 8/1991 | Maeda et al. | 430/331 |
| 5,453,401 | 9/1995 | Grivna et al. | 438/700 |
| 5,630,904 | 5/1997 | Aoyama et al. | 134/2 X |
| 5,650,356 | 7/1997 | Grivna et al. | 438/700 X |

FOREIGN PATENT DOCUMENTS

| | | |
|---|---|---|
| 0 574 858 | 12/1993 | European Pat. Off. . |
| 051569/07 | 6/1987 | Japan . |
| 002325 | 6/1989 | Japan . |
| 201794 | 8/1995 | Japan . |

*Primary Examiner*—Harold Y. Pyon
*Assistant Examiner*—Saeed Chaudhry
*Attorney, Agent, or Firm*—Frishauf, Holtz, Goodman, Langer & Chick, P.C.

[57] ABSTRACT

A method of producing a semiconductor device, which includes applying a conductive metal film on a semiconductor wafer, applying a photoresist on the conductive metal film, removing the photoresist with a removing agent containing a fluorine compound or at least one basic component selected from the group consisting of a quaternary ammonium hydroxide, an alkanolamine and a mixture of an alkanolamine and a reducing agent, and cleaning the resultant semiconductor device by rinsing with a rinse comprising water and at least one peroxide compound. The method of the present invention can provide a highly accurate wiring circuit without corrosion of the conductive metal film.

8 Claims, 1 Drawing Sheet

METHOD OF PRODUCING SEMICONDUCTOR DEVICE AND RINSE FOR CLEANING SEMICONDUCTOR DEVICE

BACKGROUND OF THE INVENTION

1. Field of the Invention

The present invention relates to a cleaning method in a process of producing semiconductor integrated circuits having a conductive metal film on a semiconductor wafer, wherein cleaning is carried out after the removal of a photoresist with a removing agent, and to a rinse for cleaning semiconductor devices that will be used in the above cleaning.

2. Description of the Related Arts

In the production of a semiconductor integrated circuit, a conductive film for a metal wiring material is formed on a semiconductor wafer by such a technique as sputtering and CVD. Then, a photoresist is applied to the conductive film and is exposed and developed by photolithography to form a pattern and the unmasked portion of the conductive film is dry-etched with a reactive gas, allowing the photoresist to serve as a mask thereby forming a fine wiring.

Thereafter, a method of removing the above photoresist film from the conductive film or a method wherein, after the formation of the fine wiring, ashing is carried out to remove the resist residue remaining on the masked portion from the conductive film is taken.

Conventionally, as photoresist removers used in these methods, acid removers and basic removers are generally used.

However, since the acid removers are weak in removing power and are strong in corrosive action on conductive metal films used for fine wiring processing, they are not so often used in recent fine wiring processing wherein strict dimensional accuracy is required.

On the other hand, since the basic removers are high in resist removability, they are recently used widely in fine wiring processing. The following basic removers can be mentioned:

(1) an aqueous solution remover comprising a quaternary ammonium hydroxide as a main agent (e.g., Japanese Patent Application Laid-Open Nos. 2325/1989 and 48633/1992)

(2) a remover comprising an alkanolamine as a main agent (e.g., Japanese Patent Application Laid-Open Nos. 88548/1989 and 222573/1994)

(3) a remover comprising an alkanolamine as a main agent and a reducing agent as an auxiliary (e.g., Japanese Patent Application Laid-Open Nos. 289866/1992 and 266119/1994)

The aqueous solution remover (1) comprising a quaternary ammonium hydroxide as a main agent greatly corrodes the conductive metal film of aluminum, an aluminum alloy, titanium, tungsten or the like as a wiring material and the corrosive action thereof is further accelerated in the case wherein pure water or ultrapure water is used as a rinse, leading to the problem that a phenomenon of corrosion in the form of numerous pits or craters takes place on the metal surface.

In the case wherein a quaternary ammonium hydroxide is used as a main agent and a saccharide or a sugaralcohol is added thereto (Japanese Patent Application Laid-Open No. 48633/1992), although corrosion of a conductive metal film is inhibited, the occurrence of a phenomenon of corrosion in the form of pits or craters cannot be avoided when pure water or ultrapure water is used as a rinse.

In the case of the remover (2) comprising an alkanolamine as a main agent, generally an alcohol, such as methanol and propanol, is used as a rinse and in addition thereto rinsing is carried out using pure water or ultrapure water. If the cleaning with an alcohol is not carried out satisfactorily, corrosion of the conductive metal film takes place in the subsequent cleaning with pure water or ultrapure water, leading to a phenomenon of corrosion in the form of pits or craters.

Further, in the case wherein after a remover comprising an alkanolamine as a main agent is used, rinsing is carried out directly using pure water or ultrapure water as a rinse without using an alcohol as a rinse, a phenomenon of corrosion of the conductive metal film proceeds extremely and the occurrence of the phenomena of corrosion in the form of numerous pits or craters cannot be avoided.

In the above (3), an alkanolamine is used as a main agent and a reducing substance, such as a hydroxylamine, is used as an auxiliary. In this case as well, generally, cleaning with an organic solvent, such as an alcohol, as a rinse is carried out and then cleaning with pure water or ultrapure water as a rinse is carried out. In some cases, cleaning with pure water or ultrapure water as a rinse is directly carried out without using an organic solvent, such as an alcohol. In both the former case and the latter case, a phenomena of corrosion takes place in the same manner as in the case of the remover (2).

Incidentally, Japanese Patent Application Laid-Open No. 184595/1994 discloses that after a basic remover is used, cleaning with a hydroxycarboxylate solvent, an alkoxycarboxylic acid solvent, an amide solvent, a lactone solvent, a sulfur compound solvent, or the like as a rinse instead of an alcohol is carried out and then cleaning with pure water or ultrapure water as a rinse is carried out. In this case as well, the same problem as that in the cases of the removers (2) and (3) is brought about, and with respect to a phenomenon of corrosion of aluminum or the like, no improvements have been achieved.

In a recent ultrafine processing technique involved in a wiring step wherein strict dimensional accuracy is required, a flammable hazardous material, such as an alcohol, has to be used as a rinse in a large amount if a basic remover is used, and any countermeasures cannot be found against corrosion in the form of craters or pits which is caused when pure water or ultrapure water is used. Therefore, it is desired to develop a safe cleaning method wherein a phenomenon of corrosion of conductive metal films is not noted.

On the other hand, in dry-etching the above conductive film, a protective deposited film that is a reaction product of a reactive gas with the resist is formed. If this protective deposited film is left, it causes breakage of wires or abnormal wiring, leading to various troubles. Therefore, it is desired to remove the protective deposited film completely. Although acid or basic organic removing agents are conventionally used generally, these removing agents are not suitable for recent ultrafine wiring processing wherein dimensional accuracy is strict because these removing agents are accompanied by such defects that they are used at high remove temperatures or are highly dangerous because of their flash points and corrode the conductive film of a metal used in ultrafine wiring processing.

Further, in the case of the above removing agents, after the removal, since a large amount of an organic solvent, such as an alcohol, is used as a rinse, it is dangerous and the step is complicated as well. In recent years, use is made, for example, of a removing agent wherein a fluorine compound is dissolved in an organic solvent, such as ethylene glycol, or a removing agent in the form of an aqueous solution comprising an organic anticorrosive agent added to a fluorine compound (Japanese Patent Application Laid-Open No. 201794/1995) as a safe and simple remove means. These fluorine-based removing agents have such advantages that the removal temperature may be ordinary temperatures and ultrapure water or pure water can be used as a rinse.

However, even if these fluorine-based removing agents are used, corrosion in the form of fine pits or craters occurring on the metal surface cannot be avoided. With respect to the basic organic removing agents, acid organic removing agents, or fluorine-based removing agents, countermeasures against such corrosion have not been found and therefore there is desired a safe and simple removing method that does not cause a phenomena of corrosion of metal wiring materials taking rinses into account.

Therefore, an object of the present invention is to provide a method of producing a semiconductor device wherein a photoresist film applied to a conductive metal film formed on a semiconductor wafer, a photoresist layer remaining after etching, any resist residue (protective deposited film or side wall protective film) remaining after etching followed by ashing, or the like is removed with a remover, which method can produce a highly accurate circuital wiring by carrying out the removal and cleaning in a safe and simple manner without corroding the conductive metal film at all.

SUMMARY OF THE INVENTION

As a result of intensive investigations with a view to solving the above problems in a method of producing semiconductor devices, the inventors of the present invention have found that, according to a method wherein a photoresist film on a conductive metal film, a photoresist film after dry-etching, or any resist residue remaining after dry-etching followed by ashing is removed with a remover and washing with a rinse of pure water or ultrapure water containing a peroxide is carried out, the conductive metal film is not corroded at all and a highly accurate circuital wiring can be produced safely since a highly dangerous organic solvent, such as an alcohol, is not used.

Further, the inventors of the present invention have found that it is suitable that after a mask of a photoresist is formed on a conductive metal film (a photolithographic process or the like), for the formation of a wiring structure by dry-etching the unmasked portion, the protective deposited film (also referred to as resist residue or side wall protective film) occurring on the side wall sections of the photoresist and the conductive film is removed with a removing agent containing a fluorine compound followed by cleaning with a rinse comprising ultrapure wafer or pure water containing a peroxide.

That is, the present invention provides a method of producing a semiconductor device, comprising cleaning with a rinse in the form of water containing a peroxide after removal of a photoresist with a removing agent in the course of removal of the photoresist applied to a conductive metal film formed on a semiconductor wafer.

Further, the present invention provides a rinse for cleaning a semiconductor device, comprising water that contains 0.1 to 30% of one or more peroxides selected from among hydrogen peroxide, benzoyl peroxide, dialkyl peroxides, hydroperoxides, and peracids.

Figure 1:
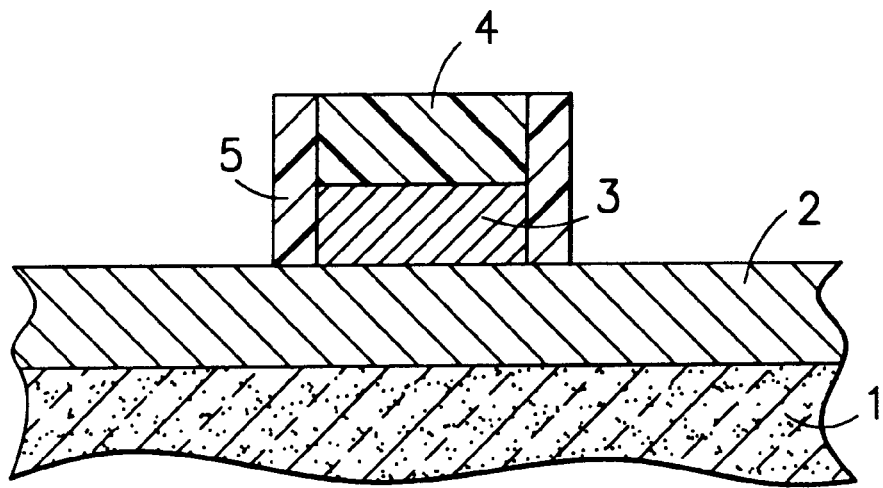
FIG. 1 shows a cross section of a semiconductor device formed with an aluminum wiring body (Al—Si—Cu layer) by dry-etching with a photoresist film used as a mask.

In the figures, 1 indicates a semiconductor substrate, 2 indicates an oxide film ($SiO_2$), 3 indicates an aluminum wiring body (Al—Si—Cu layer), 4 indicates a photoresist film, and 5 indicates a side wall protective film (photoresist residue).

DESCRIPTION OF PREFERRED EMBODIMENTS

In the present invention the conductive metal film to be formed on a semiconductor wafer is not particularly restricted and preferably is made of aluminum, an aluminum alloy, titanium, a tungsten alloy, or the like. The photoresist that will be removed with a removing agent includes, for example, a photoresist on the conductive film, a photoresist layer after dry-etching, or any resist residue remaining after dry-etching followed by ashing. In passing said resist residue is also referred to as a side wall protective film or a protective deposited film and such a protective deposited film is produced as a product of a reaction of a reactive gas with a resist on a conductive film and the side wall sections of a photoresist when a photoresist is applied to a conductive film, a mask is formed by photolithography, and a wiring structure is formed by dry-etching the unmasked portions followed by ashing.

As the removing agent for use in the present invention, for example, a basic remover can be mentioned such as those described in the description of the prior art, i.e., (1) an aqueous solution remover comprising a quaternary ammonium hydroxide as a main agent, (2) a remover comprising an alkanolamine as a main agent, and (3) a remover comprising an alkanolamine as a main agent and a reducing agent as an auxiliary, but the present invention is not limited to them, and any of aqueous or non-aqueous basic removers can be used.

Further, in the present invention, as a removing agent preferably used to remove the protective deposited film, a remover that contains a fluorine compound can be mentioned. Such a remover that contains a fluorine compound is not particularly restricted as long as it is a removing agent that contains a fluorine compound, such as hydrofluoric acid, ammonium fluoride, and ammonium hydrogenfluoride. Use can be made of any of all removing agents containing a fluorine compound, which can be in the form of an aqueous or non-aqueous solution to which an anticorrosive agent or an organic solvent or the like has been added.

In the present invention, after the removal of the photoresist with the removing agent, water containing a peroxide is used as a rinse. As the water in which a peroxide will be dissolved, pure water or ultrapure water is used.

The peroxide to be used includes (1) hydrogen peroxide, (2) benzoyl peroxide and dialkyl peroxides, such as di-t-butyl peroxide, (3) hydroperoxides, such as cumyl hydroperoxide, and (4) peracids, such as peracetic acid, perbenzoic acid, and pertoluylic acid and among these hydrogen peroxide is most preferable.

These peroxides in the rinse are used in a concentration in the range of 0.1 to 30%, and preferably 0.5 to 20%. If the concentration of the peroxide in the rinse is lower than 0.1% by weight, the corrosion preventive effect on the conductive film of aluminum or the like cannot be recognized while if the concentration is higher than 30% by weight, the corrosion preventive effect is not improved, which is not economically advantageous.

It is satisfactory that the operating temperature of the rinse in the present invention is room temperature, but, if necessary, heating or ultrasonic waves may additionally be used. Further, as a method of treating with the rinse of the present invention, dipping is usually used, but other technique, for example, spraying may be used.

After the photoresist film and the side wall protective film are removed completely with various removing agents, when cleaning with water containing a peroxide according to the method of the present invention is carried out as described above, corrosiveness of a conductive metal film (aluminum wiring body) is not recognized at all.

Further, the method of the present invention is safe as a method of producing a semiconductor device since a highly dangerous organic solvent, such as an alcohol, is not used, and therefore according to the method of the present invention, cleaning can be carried out industrially quite simply and completely to produce a highly accurate circuital wiring.

Incidentally, to the rinse containing a peroxide of the present invention may be added a surface-active agent, an organic carboxylic acid, or the like, if necessary, in order to enhance its cleaning effect.

Now, the present invention is described more specifically by way of Examples, but the present invention is not restricted by these Examples.

The ratings of the evaluation of the Examples and Comparative Examples by a surface electron microscope (SEM) observation are as follows:

(Removal)

⊙: The removal was complete.

Δ: Partial residue was noted.

X: Large part remained.

(Corrosiveness)

⊙: Corrosion was not noted at all.

O: Only a few sites of corrosion in the form of craters or pits were noted.

Δ: Corrosion in the form of craters or pits was noted.

X: Roughening was noted throughout the aluminum wiring and it was noted that the Al—Si—Cu layer was recessed.

EXAMPLES 1 TO 4 AND COMPARATIVE EXAMPLES 1 TO 4

FIG. 1 shows a cross section of a semiconductor device formed with an aluminum wiring body (Al—Si—Cu layer) 3 by dry-etching with a photoresist film used as a mask. In FIG. 1, a semiconductor substrate 1 is covered with an oxide film ($SiO_2$) 2 that is an insulating film, and a side wall protective film (photoresist residue) 5 which has been resulted from dry-etching is formed.

After the semiconductor device shown in FIG. 1 was immersed in each remover shown in Table 1 for a prescribed time, was washed with a rinse that comprised ultrapure water and a peroxide, was washed with water, and was dried, the semiconductor device was observed under SEM. The removability of the photoresist film 4 and the side wall protective film 5 and the state of corrosion of the surface of the aluminum wiring body (Al—Si—Cu layer) 3 were evaluated. The results are shown in Table 1.

TABLE 1

| | Removing liquid | | | | | |
|---|---|---|---|---|---|---|
| | Compound (1) | Conc. (wt. %) | Compound (2) | Conc. (wt. %) | Compound (3) | Conc. (wt. %) |
| Example 1 | monoethanolamine | 70 | dimethyl sulfoxide | 30 | — | — |
| Comparative Example 1 | monoethanolamine | 70 | dimethyl sulfoxide | 30 | — | — |
| Example 2 | monoethanolamine | 70 | diethylene glycol monomethyl ether | 30 | — | — |
| Comparative Example 2 | monoethanolamine | 70 | diethylene glycol monomethyl ether | 30 | — | — |
| Example 3 | monoethanolamine | 60 | diethylene glycol monomethyl ether | 20 | water | 20 |
| Comparative Example 3 | monoethanolamine | 60 | diethylene glycol monomethyl ether | 20 | water | 20 |
| Example 4 | monoethanolamine | 70 | hydroxylamine | 10 | water | 20 |
| Comparative Example 4 | monoethanolamine | 70 | hydroxylamine | 10 | water | 20 |

| | Conditions of removal | | Rinse | | Removal | | Corrosiveness |
|---|---|---|---|---|---|---|---|
| | Temp. (° C.) | Time (min) | Kind | Time (min) | Resist 4 | Side wall protective film 5 | Al (aluminum) wiring body 3 |
| Example 1 | 80 | 20 | 5% hydrogen peroxide | 10 | ⊙ | ⊙ | ⊙ |
| Comparative Example 1 | 80 | 20 | ultrapure water | 10 | ⊙ | ⊙ | Δ |
| Example 2 | 90 | 20 | 3% hydrogen peroxide | 10 | ⊙ | ⊙ | ⊙ |
| Comparative Example 2 | 90 | 20 | ultrapure water | 10 | ⊙ | ⊙ | Δ |
| Example 3 | 50 | 20 | 5% hydrogen peroxide | 10 | ⊙ | ⊙ | ⊙ |

TABLE 1-continued

| | | | | | | | |
|---|---|---|---|---|---|---|---|
| Comparative Example 3 | 50 | 20 | ultrapure water | 10 | ⊙ | ⊙ | Δ |
| Example 4 | 50 | 20 | 5% hydrogen peroxide | 10 | ⊙ | ⊙ | ⊙ |
| Comparative Example 4 | 50 | 20 | ultrapure water | 10 | ⊙ | ⊙ | Δ |

EXAMPLE 5 TO 7 AND COMPARATIVE EXAMPLES 5 TO 7

Figure 2:
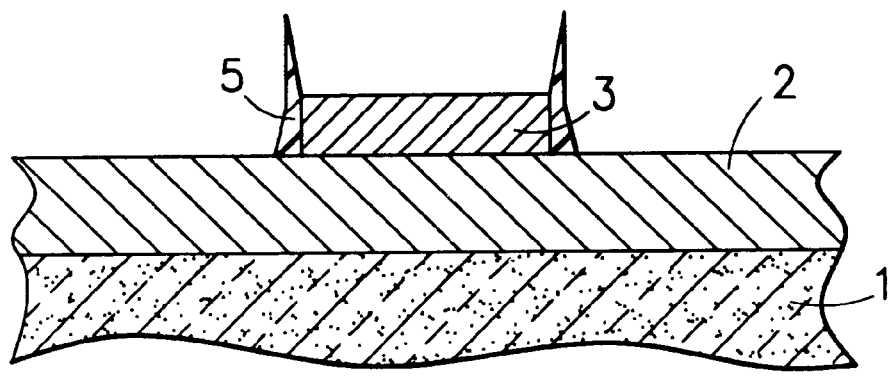
FIG. 2 shows a cross section of the semiconductor device of FIG. 1 wherein the photoresist film was removed by ashing the resist using oxygen plasma.

FIG. 2 shows a cross section of the semiconductor device of FIG. 1 wherein the photoresist film was removed by ashing the resist using oxygen plasma. In FIG. 2, the side wall protective film 5 was not removed by the oxygen plasma and the upper part of the side wall protective film 5 was deformed away from the aluminum wiring body (Al—Si—Cu layer) 3.

After the semiconductor device shown in FIG. 2 which was subjected to ashing of the resist was immersed for a prescribed time in each remover having the composition shown in Table 2, washed with a rinse that comprised ultrapure water and a peroxide, was washed with water, and was dried, the semiconductor device was observed under an electron microscope (SEM). The removal of the side protective film 5 and the state of corrosion of the surface of the aluminum wiring body (Al—Si—Cu layer) were evaluated. The results are shown in Table 2. Incidentally, in Table 2, TMAH is an abbreviation for tetramethylammonium hydroxide.

EXAMPLES 8 TO 11 AND COMPARATIVE EXAMPLES 8 TO 11

After the semiconductor device shown in FIG. 2 which was subjected to ashing of the resist was immersed for a prescribed time in each remover having the composition shown in Table 3 for a prescribed time, washed with a rinse that comprised ultrapure water and a peroxide, was washed with water, and was dried, the semiconductor device was observed under SEM.

The removal of the side wall protective film 5 and the state of corrosion of the surface of the aluminum wiring body (Al—Si—Cu layer) 3 were evaluated. The results are shown in Table 3.

TABLE 2

| | Removing liquid | | | | | |
|---|---|---|---|---|---|---|
| | Compound (1) | Conc. (wt. %) | Compound (2) | Conc. (wt. %) | Compound (3) | Conc. (wt. %) |
| Example 5 | TMAH | 0.5 | sorbitol | 5 | water | 94.5 |
| Comparative Example 5 | TMAH | 0.5 | sorbitol | 5 | water | 94.5 |
| Example 6 | TMAH | 1.2 | water | 98.8 | — | — |
| Comparative Example 6 | TMAH | 1.2 | water | 98.8 | — | — |
| Example 7 | monoethanolamine | 70 | dimethyl sulfoxide | 30 | — | — |
| Comparative Example 7 | monoethanolamine | 70 | dimethyl sulfoxide | 30 | — | — |

| | Conditions of removal | | Rinse | | Removal Side wall protective film 5 | Corrosiveness Al (aluminum) wiring body 3 |
|---|---|---|---|---|---|---|
| | Temp. (°C.) | Time (min) | Kind | Time (min) | | |
| Example 1 | 23 | 3 | 5% hydrogen peroxide | 10 | ⊙ | ⊙ |
| Comparative Example 1 | 23 | 3 | ultrapure water | 10 | ⊙ | Δ |
| Example 2 | 23 | 2 | 10% hydrogen peroxide | 10 | ⊙ | Δ–⊙ |
| Comparative Example 2 | 23 | 2 | ultrapure water | 10 | ⊙ | x–Δ |
| Example 3 | 80 | 15 | 5% hydrogen peroxide | 10 | Δ–⊙ | ⊙ |
| Comparative Example 3 | 80 | 15 | ultrapure water | 10 | Δ–⊙ | Δ |

TABLE 3

| | Removing liquid | | | | | | | |
|---|---|---|---|---|---|---|---|---|
| | Compound (1) | Conc. (wt. %) | Compound (2) | Conc. (wt. %) | Compound (3) | Conc. (wt. %) | Compound (4) | Conc. (wt. %) |
| Example 8 | ammonium hydrogenfluoride | 0.3 | ethylene glycol | 99.7 | — | — | — | — |
| Comparative Example 8 | ammonium hydrogenfluoride | 0.3 | ethylene glycol | 99.7 | — | — | — | — |
| Example 9 | ammonium fluoride | 5.0 | dimethylformamide | 40 | — | 10 | water | 45.0 |
| Comparative Example 9 | ammonium fluoride | 5.0 | dimethylformamide | 40 | — | 10 | water | 45.0 |
| Example 10 | ammonium fluoride | 1.0 | formamide | 50 | — | 2 | water | 38.0 |
| Comparative Example 10 | ammonium fluoride | 1.0 | formamide | 50 | — | 2 | water | 38.0 |
| Example 11 | ammonium fluoride | 0.6 | dimethylformamide | 40 | — | — | water | 59.4 |
| Comparative Example 11 | ammonium fluoride | 0.6 | dimethylformamide | 40 | — | — | water | 59.4 |

| | Conditions of removal | | Rinse | | Removal Side wall | Corrosiveness |
|---|---|---|---|---|---|---|
| | Temp. (° C.) | Time (min) | Kind | Time (min) | protective film 5 | Al wiring body 3 |
| Example 8 | 23 | 5 | 5% hydrogen peroxide | 10 | ⊚ | ○ |
| Comparative Example 8 | 23 | 5 | ultrapure water | 10 | ⊚ | x |
| Example 9 | 23 | 3 | 3% hydrogen peroxide | 10 | ⊚ | ⊚ |
| Comparative Example 9 | 23 | 3 | ultrapure water | 10 | ⊚ | Δ |
| Example 10 | 23 | 5 | 1% hydrogen peroxide | 10 | ⊚ | ⊚ |
| Comparative Example 10 | 23 | 5 | ultrapure water | 10 | ⊚ | Δ |
| Example 11 | 23 | 10 | 5% hydrogen peroxide | 10 | ⊚ | ⊚ |
| Comparative Example 11 | 23 | 10 | ultrapure water | 10 | Δ | Δ |

What is claimed is:

1. A method of producing a semiconductor device, comprising:

applying a conductive metal film on a semiconductor wafer, applying a photoresist layer on the conductive metal film, removing the photoresist layer with a removing agent consisting essentially of a fluorine compound selected from the group consisting of hydrofluoric acid, ammonium fluoride and ammonium hydrogenfluoride, and cleaning the resultant semiconductive device by rinsing with a rinse consisting essentially of water and at least one peroxide compound.

2. The method of producing a semiconductor device as claimed in claim 1, wherein the photoresist is a photoresist layer formed as a mask by photolithography and etching unmasked portions.

3. The method of producing a semiconductor device as claimed in claim 1, wherein the photoresist is photoresist residue remaining after formation of a mask by photolithography, etching unmasked portions and then ashing.

4. The method of producing a semiconductor device as claimed in claim 1, which further comprises forming a protective deposited film as a side wall of the photoresist layer and the conductive metal film, in the formation of a wiring structure by formation of a mask by photolithography and dry-etching unmasked portions.

5. The method or producing a semiconductor device as claimed in claim 1, where the at least one peroxide compound is in a concentration of 0.1 to 30 wt. % and is selected from the group consisting of hydrogen peroxide, benzoyl peroxide, a dialkyl peroxide, hydroperoxide and a peracid.

6. The method of producing a semiconductor device as claimed in claim 1, wherein the at least one peroxide compound is selected from the group consisting of di-t-butyl peroxide, cumyl hydroperoxide and pertoluyic acid.

7. The method of producing a semiconductor device as claimed in claim 1, wherein the at least one peroxide compound is hydrogen peroxide in a concentration of 0.1 to 30 wt. %.

8. The method of producing a semiconductor device as claimed in claim 7, wherein the conductive metal film comprises aluminum.

* * * * *